(12) United States Patent
Alavi

(10) Patent No.: US 10,877,544 B2
(45) Date of Patent: Dec. 29, 2020

(54) MEMORY MANAGEMENT SYSTEM WITH BACKUP SYSTEM AND METHOD OF OPERATION THEREOF

(71) Applicant: SMART Modular Technologies, Inc., Newark, CA (US)

(72) Inventor: Amir Alavi, Aliso Viejo, CA (US)

(73) Assignee: SMART Modular Technologies, Inc., Newark, CA (US)

( * ) Notice: Subject to any disclaimer, the term of this patent is extended or adjusted under 35 U.S.C. 154(b) by 252 days.

(21) Appl. No.: 14/994,065

(22) Filed: Jan. 12, 2016

(65) Prior Publication Data

US 2017/0199684 A1  Jul. 13, 2017

(51) Int. Cl.
| | | |
|---|---|---|
| G06F 1/3225 | (2019.01) | |
| G06F 13/28 | (2006.01) | |
| G11C 5/14 | (2006.01) | |
| G06F 1/30 | (2006.01) | |
| G06F 12/02 | (2006.01) | |
| G06F 11/14 | (2006.01) | |
| G11C 16/10 | (2006.01) | |
| G11C 7/24 | (2006.01) | |

(52) U.S. Cl.
CPC ............ *G06F 1/3225* (2013.01); *G06F 1/30* (2013.01); *G06F 11/1402* (2013.01); *G06F 12/0246* (2013.01); *G06F 13/28* (2013.01); *G06F 2212/1032* (2013.01); *G06F 2212/401* (2013.01); *G11C 5/141* (2013.01); *G11C 7/24* (2013.01); *G11C 16/10* (2013.01); *G11C 2207/102* (2013.01)

(58) Field of Classification Search
CPC .... G06F 3/0608; G06F 3/0656; G06F 1/3203; G06F 9/4418; G06F 2212/202; G06F 2212/401
See application file for complete search history.

(56) References Cited

U.S. PATENT DOCUMENTS 5,179,667 A * 1/1993 Iyer ..................... G06F 13/1605
711/105
5,490,260 A * 2/1996 Miller ................... G06F 3/0601
711/100

(Continued)

OTHER PUBLICATIONS

Huang, Henry F., and Tao Jiang. "Design and implementation of flash based nvdimm." Non-Volatile Memory Systems and Applications Symposium (NVMSA), 2014 IEEE. IEEE, 2014. (Year: 2014).*

(Continued)

*Primary Examiner* — Charles Rones
*Assistant Examiner* — Hewy H Li
(74) *Attorney, Agent, or Firm* — Wong & Rees LLP

(57) ABSTRACT

An memory management system with backup system, and a method of operation of a memory management system with backup system thereof, including: a memory module controller for detecting a power failure condition, the memory module controller including a nonvolatile memory controller; a compression controller integrated within the nonvolatile memory controller for receiving a data block from volatile memory; a compression engine within the compression controller for compressing the data block to form a compressed data block; and a sequencer for writing the compressed data block to nonvolatile memory.

20 Claims, 3 Drawing Sheets

(56) References Cited

U.S. PATENT DOCUMENTS

| | | | | |
|---|---|---|---|---|
| 6,170,743 | B1* | 1/2001 | Okaue | G06K 19/07 235/379 |
| 6,879,266 | B1* | 4/2005 | Dye | G06F 12/08 341/51 |
| 8,347,023 | B2* | 1/2013 | Yang | G06F 12/0246 711/103 |
| 2005/0038958 | A1* | 2/2005 | Jadon | G06F 3/061 711/114 |
| 2008/0010420 | A1* | 1/2008 | Kao | G06F 12/0223 711/154 |
| 2009/0070356 | A1* | 3/2009 | Mimatsu | H03M 7/30 |
| 2011/0107020 | A1* | 5/2011 | Duan | G01S 19/34 711/104 |
| 2013/0179752 | A1* | 7/2013 | Shim | G06F 11/10 714/773 |
| 2013/0254441 | A1* | 9/2013 | Kipnis | H03M 7/30 710/68 |
| 2016/0118121 | A1* | 4/2016 | Kelly | G06F 13/4068 710/301 |
| 2016/0342487 | A1* | 11/2016 | Ware | G11C 7/20 |
| 2016/0350009 | A1* | 12/2016 | Cerreta | G11C 14/0018 |
| 2016/0364298 | A1* | 12/2016 | Chiou | G06F 11/1441 |
| 2017/0060697 | A1* | 3/2017 | Berke | G06F 3/0619 |
| 2017/0160956 | A1* | 6/2017 | Chinnakkonda Vidyapoornachary | G11C 5/04 |

OTHER PUBLICATIONS

"Direct Memory Access (DMA)". University of British Columbia. Published Winter 1998-1999. <www.ece.ubc.ca/~edc/379.jan99/lectures/lec13.pdf>. (Year: 1999).*

Wang, Yiqun, et al. "A compression-based area-efficient recovery architecture for nonvolatile processors." Proceedings of the Conference on Design, Automation and Test in Europe. EDA Consortium, 2012. (Year: 2012).*

Corbet, Jonathan, Alessandro Rubini, and Greg Kroah-Hartman. Linux Device Drivers: Where the Kernel Meets the Hardware. Chapter 15.4. "O'Reilly Media, Inc.", 2005. (Year: 2005).*

* cited by examiner

MEMORY MANAGEMENT SYSTEM WITH BACKUP SYSTEM AND METHOD OF OPERATION THEREOF

TECHNICAL FIELD

The present invention relates generally to a memory management system, and more particularly to a system for backing up data.

BACKGROUND ART

There is a continual need in the area of electronics and electronic computing systems toward smaller systems and/or systems with greater computing performance for a given space and within a given power profile. Within these systems, the integrated circuit and memory modules are the building block used in high performance electronic systems to provide applications for usage in products such as automotive vehicles, computers, cell phone, intelligent portable military devices, aeronautical spacecraft payloads, and a vast line of other similar products that require small compact electronics supporting many complex functions.

Products must compete in world markets and attract many consumers or buyers in order to be successful. It is very important for products to continue to improve in features, performance, and reliability while reducing product costs, product size, and to be available quickly for purchase by the consumers or buyers. Manufacturing improvements may increase reliability of a product itself, but there are situations out of the manufacturer's control which also may impact the user experience, such as extreme temperatures and pressures, simple user error, and unreliable power supply.

Thus, a need still remains for a system to reliably and safely backup user data even when there is a loss of system power. In view of the growing importance of data and data structures, it is increasingly critical that answers be found to these problems in order to ensure that user data is not lost. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of operation of a memory management system with backup system that includes detecting a power failure condition with a memory module controller, the memory module controller including a nonvolatile memory controller; receiving a data block from volatile memory at a compression controller integrated within the nonvolatile memory controller; compressing the data block to form a compressed data block; and writing the compressed data block to nonvolatile memory.

The present invention provides a memory management system with backup system that includes a memory module controller for detecting a power failure condition, the memory module controller including a nonvolatile memory controller; a compression controller integrated within the nonvolatile memory controller for receiving a data block from volatile memory; a compression engine within the compression controller for compressing the data block to form a compressed data block; and a sequencer for writing the compressed data block to nonvolatile memory.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
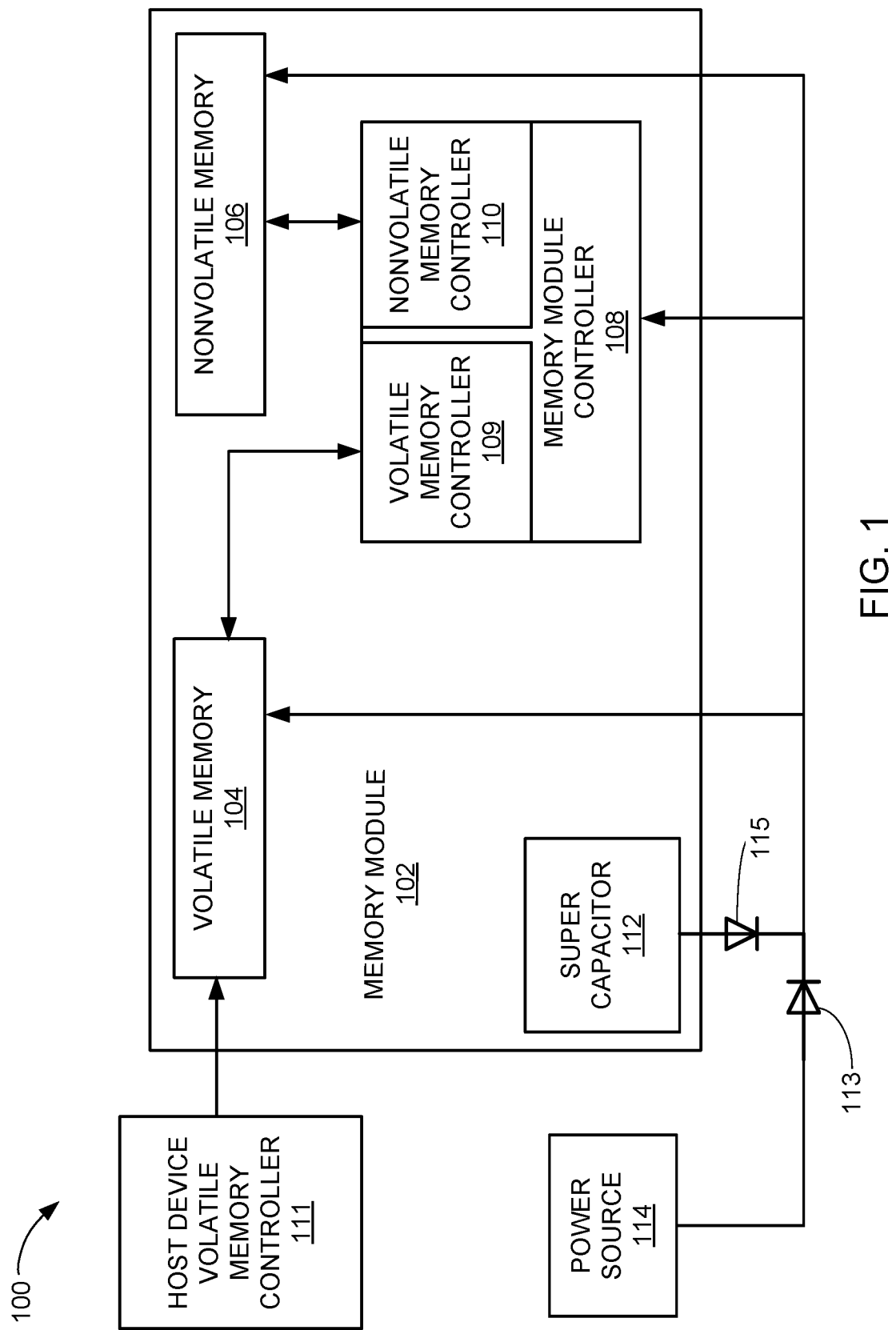
FIG. 1 is a functional block diagram of a memory management system with backup system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGS. Similarly, although the views in the drawings for ease of description generally show similar orientations, this depiction in the FIGS. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

Referring now to FIG. 1, therein is shown a functional block diagram of a memory management system 100 with backup system in an embodiment of the present invention. The memory management system 100 can include a memory module 102 having both volatile memory 104 and nonvolatile memory 106, for example. As another example, the memory management system 100 can include a memory module having DRAM and NAND flash memory as an example of the volatile memory 104 and the nonvolatile memory 106, respectively. The memory module 102 can include a memory module controller 108, a volatile memory controller 109, and a nonvolatile memory controller 110.

The memory module 102 can also include a super capacitor 112. The memory module 102 is ordinarily connected to some type of a power source 114. The super capacitor 112 is shown as just one super capacitor, but it is understood that more than one super capacitor may be used depending on the power requirements of the nonvolatile memory 106.

The memory module 102 and the power source 114 can be part of a larger host device (not shown for clarity). A host device volatile memory controller 111 can interface with the volatile memory 104 when the host device is operating normally and the power source 114 is properly connected and operating.

The nonvolatile memory 106 can function as part of the backup system of the memory management system 100. The volatile memory 104 requires that the power source 114 be present. If there is a loss of connection between the power source 114 in the volatile memory 104 or any kind of power failure whatsoever, without any backup system, data within the volatile memory 104 would then be lost. However, in the memory management system 100 with the nonvolatile memory 106 as part of the backup system, data can be backed up from the volatile memory 104 to the nonvolatile memory 106 in the event of a power failure.

For example, the memory module controller 108 can remain in standby mode during normal operation of the memory module 102. Normal operation of the memory module requires connection to the power source 114, and in this mode the host device volatile memory controller 111 will perform normal operations reading and writing to the volatile memory 104.

The memory module 102 and its various components are powered by either the power source 114 or the super capacitor 112, but never both at the same time. Circuitry can be included to ensure this separation. In this example, a power source diode 113 and a super capacitor diode 115 can ensure that only one power source operates at one time. However, it is understood that these two diodes are used for example only, and any circuitry can be used so long as it allows the super capacitor 112 to be used upon loss of connection to the power source 114. In the event of a power failure, the memory module controller 108 containing the nonvolatile memory controller 110 and the volatile memory controller 109 can assert control and use the power available from the super capacitor 112 to transfer data from the volatile memory 104 to the nonvolatile memory 106.

As a more specific example, the memory module 102 can be a nonvolatile dual in-line memory module type N (NVDIMM-N), which includes both volatile and nonvolatile memory. For example, the volatile memory 104 can be some type of DDR SDRAM (Double Data Rate Synchronous Random Access Memory; for example: DDR3 SDRAM, DDR4 SDRAM, etc.), and the nonvolatile memory 106 can be NAND flash memory. In the event of a power failure, the memory module controller 108 can assert control of the DRAM (the volatile memory 104 in this example) and can backup the data in the DRAM to the flash memory (the nonvolatile memory 106 in this example) utilizing the power stored within the super capacitor 112. The nonvolatile memory controller 110 and the volatile memory controller 109 can be integrated within the memory module controller 108, for example.

Figure 2:
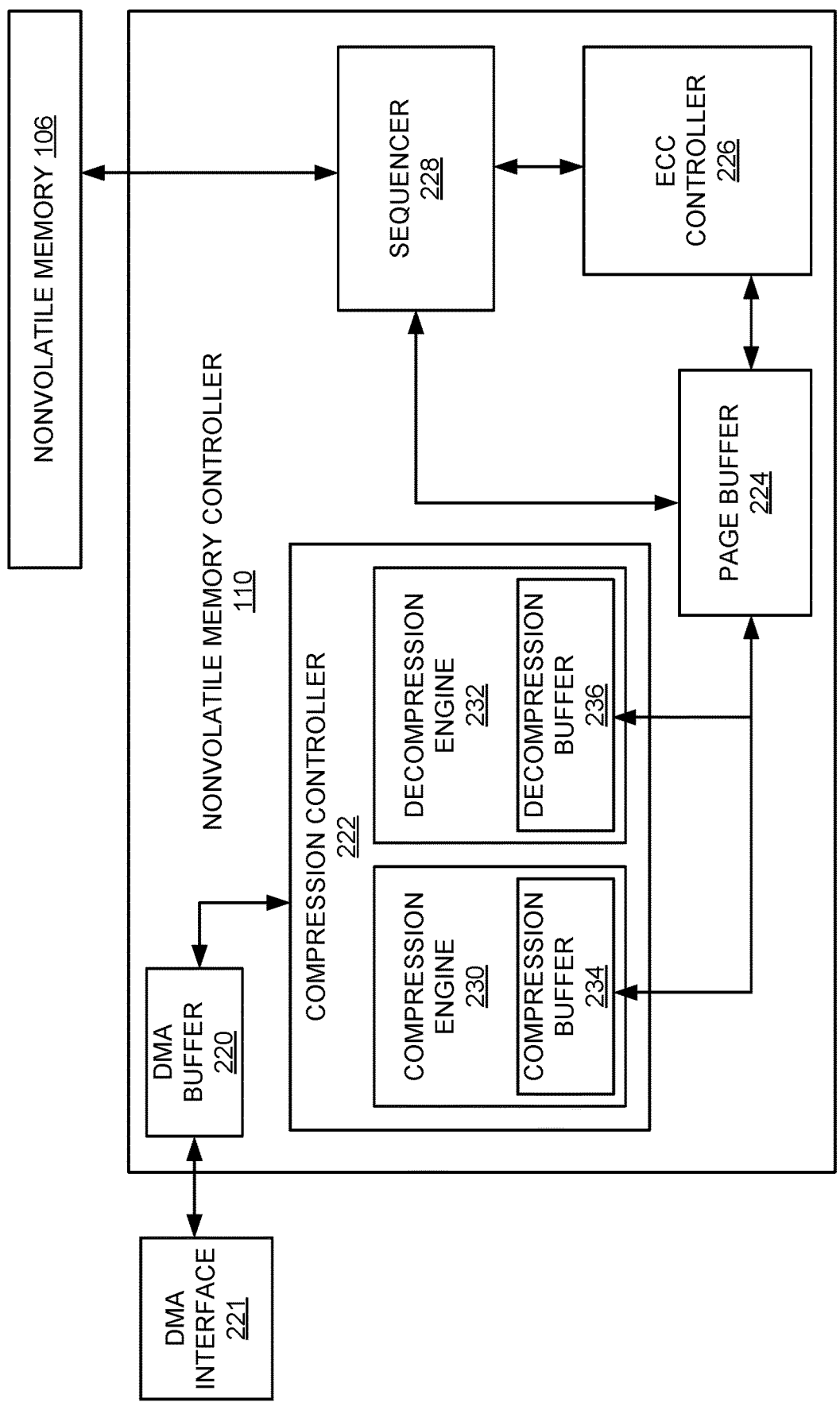
FIG. 2 is a detailed block diagram of the nonvolatile memory controller of FIG. 1.

Referring now to FIG. 2, therein is shown a detailed block diagram of the nonvolatile memory controller 110 of FIG. 1. The nonvolatile memory controller 110 includes a DMA buffer 220, a compression controller 222, a page buffer 224, an ECC controller 226, and a sequencer 228. Other components are included or omitted for clarity. The nonvolatile memory controller 110 is connected between the volatile memory 104 of FIG. 1 and the nonvolatile memory 106, which could be DRAM and NAND flash memory, respectively, as an example. Only the nonvolatile memory controller 110 is shown in detail for clarity. Also for clarity, the DMA buffer 220 is shown connected to a DMA interface 221 and the sequencer 228 is connected to the nonvolatile memory 106.

Upon detection of a power failure, a DMA transfer from the volatile memory 104 can be initiated. The nonvolatile memory controller 110 can utilize the compression controller 222 to compress data from the volatile memory 104 before backing up such data to the nonvolatile memory 106. The compression controller 222 is integrated into the nonvolatile memory controller 110, which in turn can be integrated into the memory module controller 108 of FIG. 1.

It has been discovered that on data which has a high compression or compressibility ratio, integrating the compression controller 222 within the nonvolatile memory controller 110 can improve the speed of data transfer and can lower necessary backup power requirements. For example, although compressing data with the compression controller 222 can add some latency to a data transfer process, the latency is outweighed because in this example application, the access to memory is sequential and the delay at the beginning of data transfer is not considerable. In turn, an increase in data transfer speed can allow for faster backup time, which can improve the reliability of the memory module 102. For example, for a given application with no compression controller integrated into the memory controller, four or more super capacitors may be required; however, with the compression controller 222, the backup power requirements may decrease and perhaps fewer super capacitors may then be required. In this example, this would reduce the amount of physical space taken up by the super capacitors and would also lower the cost of the final package. Manufacturing may also be simplified.

It has also been discovered that integrating the compression controller 222 within the nonvolatile memory controller 110 can improve reliability. Due to the above discussed lower back up power requirements, fewer super capacitors may be required. Not only does this lower manufacturing complexity and material costs, it also decreases the chance that any given super capacitor may fail. As the number of super capacitors goes up, the likelihood that any one of them will fail and require replacement also increases. This improvement in reliability can greatly decrease maintenance or replacement costs.

Additionally, it has been discovered that integrating the compression controller 222 within the nonvolatile memory controller 110 can improve reliability of the nonvolatile memory 106. As is understood within the art, nonvolatile or flash memory degrades in proportion to the amount of writes or reads which it is subjected to. Because data is compressed before being written to the nonvolatile memory 106, less wear and tear is placed on the nonvolatile memory 106 and this leads directly to greater reliability for the nonvolatile memory 106 and a longer life.

A more detailed example of how the compression controller 222 is utilized follows. Once a power failure or loss of power is detected, a DMA transfer from the volatile memory 104 can be initiated. Data is first transferred from the volatile memory 104 to the DMA buffer 220 through the DMA interface 221. In this example, the DMA buffer 220 can be 64 kB in size, but it is understood that other sizes are possible as technology improves. The compression controller 222 can include a compression engine 230, a decompression engine 232, a compression buffer 234, and a decompression buffer 236.

The compression controller 222 can read, for example, one kB of data from the DMA buffer 220 and temporarily store the data in the compression buffer 234. The compression engine 230 can be utilized to compress this chunk or block of data within the compression buffer 234. The compression controller 222 can then transfer the compressed data to the page buffer 224 until the page buffer 224 is full. If the last compressed chunk of data is not aligned with the page size of the nonvolatile memory 106 of FIG. 1, for example, the compression controller 222 can pad the last chunk of data to properly align with the page size.

Once the page buffer 224 is full, the sequencer 228 can cause the data to be transferred to the ECC controller 226. The ECC controller 226 can add error correction information to the data and the sequencer 228 can send the compressed data and the error correction information to the nonvolatile memory 106.

Also for example, the host device (not shown) can modify the operation of the compression controller 222. For example, some types of data are more compressible than others; already compressed image and video formats may not be good candidates for compression. On the other hand, memory opcode (operation code) may be highly compressible (have a high compressibility ratio) and can be a good candidate for compression by the compression controller 222. Further, if it is determined that a data block has a compressibility ratio below a given threshold, compression of that data block can be disabled to avoid wasting time and power on compressing a data block which is not very compressible.

The use of the compression controller 222 can be enabled or disabled dynamically by the host depending on the type of data or compressibility of each data block stored within the volatile memory 104 such as DRAM. As a further example, the exact algorithm used by the compression controller 222 may also be modified or changed depending on the type of data being compressed. For example, while a Lempel-Ziv (LZ77 or LC78) algorithm may be a useful algorithm for general compression, if the host device, the compression controller 222, or the nonvolatile memory controller 110 determines that the data may be compressed better by more specialized algorithm, that specialized algorithm may be used instead. The variation in compressibility does not affect the overall benefits of the compression controller 222 integrated into the nonvolatile memory controller 110.

Upon restoration of power to the host device after a power failure, a read command can be issued to the nonvolatile memory 106 to recover the data which was backed up from the volatile memory 104 upon detection of the power failure. The read process is basically the reverse of the write process as indicated by the double headed arrows in the figure.

For example, the ECC controller 226 in conjunction with the sequencer 228 can extract error correction information from the backed up data and write the rest of the data to the page buffer 224. The compression controller 222 can utilize the decompression engine 232 with the decompression buffer 236 to decompress the data and the compression controller 222 can then write the uncompressed data to the DMA buffer 220. The uncompressed data can then be written to the volatile memory 104; after all the backup data is decompressed and written to the volatile memory 104, the state of the volatile memory 104 immediately prior to the loss of power should be restored.

Figure 3:
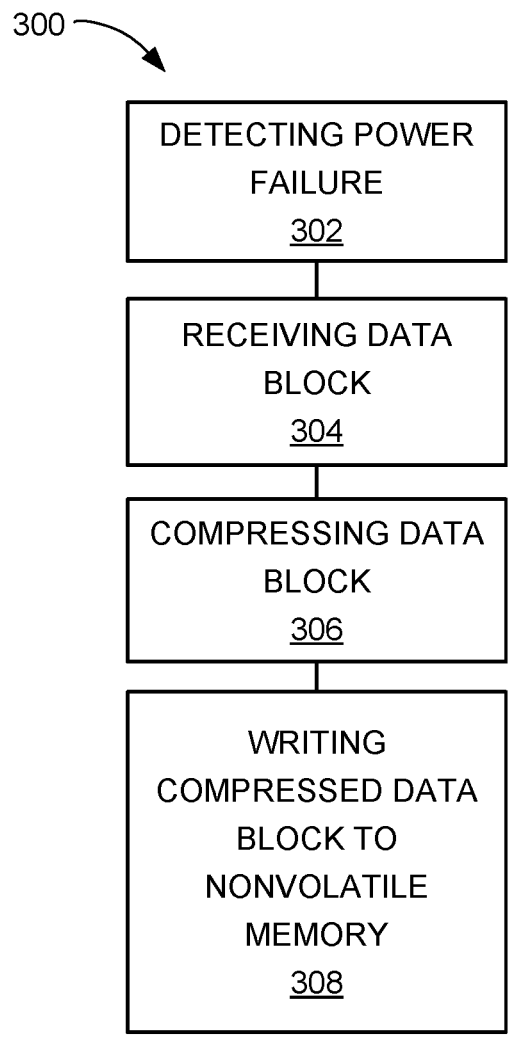
FIG. 3 is a flow chart of a method of operation of a memory management system with backup system in a further embodiment of the present invention.

Referring now to FIG. 3, therein is shown a flow chart of a method 300 of operation of a memory management system with backup system in a further embodiment of the present invention. The method 300 includes: detecting a power failure condition with a memory module controller, the memory module controller including a nonvolatile memory controller in a block 302; receiving a data block from volatile memory at a compression controller integrated within the nonvolatile memory controller in a block 304; compressing the data block to form a compressed data block in a block 306; and writing the compressed data block to nonvolatile memory in a block 308.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of operation of a memory management system with backup system comprising:
   accessing a volatile memory in a memory module from an external host controller when a memory module controller for the memory module is in standby mode, the memory module controller including a volatile memory controller and a nonvolatile memory controller in the memory module;
   initiating a direct memory access (DMA) transfer for a first data block and a second data block of the volatile memory in the memory module to a DMA buffer in the nonvolatile memory controller, upon detection of a power failure condition at a host;
   reading the DMA buffer with a compression controller integrated within the nonvolatile memory controller, the compression controller compressing data blocks using a one kilobyte (KB) compression buffer of the compression controller and storing each compressed one KB data block in the non-volatile memory;
   compressing the first data block to form a first compressed data block using a first compression algorithm;
   copying the first compressed data block to the page buffer in the nonvolatile memory controller;
   configuring the compression controller dynamically to use a second compression algorithm;
   compressing the second data block to form a second compressed data block using the second compression algorithm;
   filling a page buffer until full with the second compressed data block, the second compressed data block in the page buffer padded to align the page buffer with a page size of the non-volatile memory;

calculating an error correction information for the page buffer having the first compressed data block and the second compressed data block;

writing the page buffer to a nonvolatile memory on the memory module; and powering the volatile memory, the non-volatile memory, and the compression controller from a power source on the memory module, the power source having a number of super capacitors, the number of super capacitors selected to provide enough power to transfer all data from the volatile memory to the non-volatile memory using the compression controller.

2. The method as claimed in claim 1 wherein compressing the first data block includes compressing the first data block using the first compression algorithm selected based on a data type of the first data block.

3. The method as claimed in claim 1 wherein initiating the direct memory access includes detecting a loss of power from a power source.

4. The method as claimed in claim 1 wherein compressing the first data block includes:
 determining a compressibility ratio of the first data block; and
 choosing the first compression algorithm based on the compressibility ratio of the first data block with a compression engine within the compression controller.

5. The method as claimed in claim 1 wherein compressing the first data block includes:
 determining a compressibility ratio of the first data block; and
 disabling compression based on the compressibility ratio of the first data block being below a compressibility threshold.

6. A method of operation of a memory management system with backup system comprising:
 accessing a volatile memory in a memory module from an external host controller when a memory module controller for the memory module is in standby mode, the memory module controller including a volatile memory controller and a nonvolatile memory controller in the memory module;
 initiating a direct memory access (DMA) transfer for a first data block and a second data block of the volatile memory in the memory module to a DMA buffer in the nonvolatile memory controller in the memory module, upon detection of a power failure condition at a host;
 transferring the first data block of the DMA buffer to a compression controller integrated within the nonvolatile memory controller, the compression controller compressing data blocks using a one kilobyte (KB) compression buffer of the compression controller and storing each compressed one KB data block in the non-volatile memory;
 determining a compressibility ratio of the first data block;
 choosing a compression algorithm based on the compressibility ratio of the first data block with a compression engine within the compression controller;
 compressing the data block to form a first compressed data block using a first compression algorithm;
 copying the first compressed data block to the page buffer;
 compressing the second data block to form a second compressed data block using a second compression algorithm;
 filling a page buffer until full with the second compressed data block, the second compressed data block in the page buffer padded to align the page buffer with a page size of the non-volatile memory;

calculating an error correction information for the page buffer having the first compressed data block and the second compressed data block;

writing the page buffer to a nonvolatile memory on the memory module; and powering the volatile memory, the non-volatile memory, and the compression controller from a power source on the memory module, the power source having a number of super capacitors, the number of super capacitors selected to provide enough power to transfer all data from the volatile memory to the non-volatile memory using the compression controller.

7. The method as claimed in claim 6 wherein the volatile memory, the nonvolatile memory, and the compression controller are powered only by the power source on the memory module after detecting the power failure condition.

8. The method as claimed in claim 6 further comprising writing the first compressed data block to the page buffer.

9. The method as claimed in claim 6 further comprising:
 writing the first compressed data block to the page buffer; and
 transferring the first compressed data block to an ECC controller.

10. The method as claimed in claim 6 further comprising:
 writing the first compressed data block to the page buffer;
 transferring the first compressed data block to an ECC controller; and
 adding error correction information to the first compressed data block.

11. A memory management system with backup system comprising:
 a memory module including:
  a memory module controller for detecting a power failure condition at a host;
  a volatile memory coupled to the memory module controller with a volatile memory controller; the volatile memory accessible from an external host controller,
  a non-volatile memory coupled to the memory module controller with a nonvolatile memory controller,
  a direct memory access (DMA) buffer for receiving a DMA transfer from a first data block and a second data block;
  a compression engine within a compression controller for compressing the first data block to form a first compressed data block and the second data block to form a second compressed data block, the compression controller compressing data blocks using a one kilobyte (KB) compression buffer of the compression controller and storing each compressed one KB data block in the non-volatile memory, the first data block compressed with a first compression algorithm, the second data block compressed with a second compression algorithm, and filling a page buffer until full with the second compressed data block, and padding the page buffer to align with a page size of the non-volatile memory before writing the page buffer to a nonvolatile memory on the memory module;
  an error correction code (ECC) controller of the non-volatile memory controller for calculating an error correction information for the page buffer having the first compressed data block and the second compressed data block;
  a power source on the memory module, the power source having a number super capacitors, the number of super capacitors selected to provide enough power to transfer all data from the volatile memory to the non-volatile memory using the compression controller; and a sequencer for writing the page buffer to the nonvolatile memory.

12. The system as claimed in claim 11 further comprising the compression buffer within the compression controller for compressing the first data block based on a data type of the first data block.

13. The system as claimed in claim 11 wherein the nonvolatile memory controller is within the memory module controller.

14. The system as claimed in claim 11 wherein the compression engine is for:
 determining a compressibility ratio of the first data block; and
 choosing a compression algorithm based on the compressibility ratio of the first data block.

15. The system as claimed in claim 11 wherein:
 the compression engine is for determining a compressibility ratio of the first data block; and
 the compression controller is for disabling compression based on the compressibility ratio of the first data block being below a compressibility threshold.

16. The system as claimed in claim 11 wherein
 the compression buffer is within the compression controller; and
wherein:
 the compression engine is for determining a compressibility ratio of the first data block, and choosing a compression algorithm based on the compressibility ratio of the first data block.

17. The system as claimed in claim 16 wherein the volatile memory, the nonvolatile memory, and the compression controller are powered only by the power source on the memory module after detecting the power failure condition.

18. The system as claimed in claim 16 further comprising the page buffer coupled to the compression controller.

19. The system as claimed in claim 16 further comprising:
 the page buffer coupled to the compression controller; and
 the ECC controller coupled to the page buffer.

20. The system as claimed in claim 16 further comprising:
 the page buffer coupled to the compression controller; and
 the ECC controller coupled to the page buffer and the sequencer.

* * * * *